United States Patent [19]

Ikeno et al.

[11] Patent Number: 5,045,527

[45] Date of Patent: Sep. 3, 1991

[54] METHOD OF PRODUCING A SUPERCONDUCTIVE OXIDE CONDUCTOR

[75] Inventors: Yoshimitsu Ikeno; Osamu Kohno; Kenji Goto; Atsushi Kume; Shin'ya Aoki; Nobuyuki Sadakata; Masaru Sugimoto; Toshio Usui; Mikio Nakagawa; Taichi Yamaguchi, all of Tokyo, Japan

[73] Assignee: Fujikura Ltd., Tokyo, Japan

[21] Appl. No.: 251,847

[22] Filed: Oct. 3, 1988

[30] Foreign Application Priority Data

| Oct. 2, 1987 | [JP] | Japan | 62-249525 |
| Oct. 2, 1987 | [JP] | Japan | 62-249526 |
| Oct. 2, 1987 | [JP] | Japan | 62-249527 |
| Oct. 2, 1987 | [JP] | Japan | 62-249528 |
| Oct. 16, 1987 | [JP] | Japan | 62-261173 |
| Oct. 28, 1987 | [JP] | Japan | 62-272302 |
| Oct. 28, 1987 | [JP] | Japan | 62-272303 |
| Oct. 28, 1987 | [JP] | Japan | 62-272304 |
| Nov. 6, 1987 | [JP] | Japan | 62-280450 |
| Nov. 6, 1987 | [JP] | Japan | 62-280451 |
| Nov. 6, 1987 | [JP] | Japan | 62-280452 |
| Nov. 6, 1987 | [JP] | Japan | 62-280453 |
| Nov. 16, 1987 | [JP] | Japan | 62-288679 |
| Nov. 25, 1987 | [JP] | Japan | 62-296704 |
| Nov. 30, 1987 | [JP] | Japan | 62-302178 |
| Dec. 8, 1987 | [JP] | Japan | 62-309996 |
| Dec. 8, 1987 | [JP] | Japan | 62-309997 |
| Dec. 8, 1987 | [JP] | Japan | 62-309998 |
| Dec. 28, 1987 | [JP] | Japan | 62-332404 |
| Dec. 28, 1987 | [JP] | Japan | 62-332405 |
| Dec. 28, 1987 | [JP] | Japan | 62-332407 |
| Dec. 28, 1987 | [JP] | Japan | 62-332408 |
| Dec. 28, 1987 | [JP] | Japan | 62-332409 |
| Dec. 28, 1987 | [JP] | Japan | 62-332411 |
| Dec. 28, 1987 | [JP] | Japan | 62-332412 |
| Jan. 11, 1988 | [JP] | Japan | 63-3329 |
| Jan. 27, 1988 | [JP] | Japan | 63-16305 |
| Jan. 29, 1988 | [JP] | Japan | 63-18589 |
| Mar. 8, 1988 | [JP] | Japan | 63-54042 |
| Mar. 28, 1988 | [JP] | Japan | 63-73928 |
| Mar. 28, 1988 | [JP] | Japan | 63-73929 |

[51] Int. Cl.$^5$ .............................. H01L 39/12
[52] U.S. Cl. ............................. 505/1; 505/740
[58] Field of Search ............. 156/48, 51; 164/461; 264/56, 61, 65, 66; 505/1, 704, 740, 915, 930

[56] References Cited

U.S. PATENT DOCUMENTS

| 3,795,978 | 3/1974 | Raymond et al. | 505/915 |
| 4,125,924 | 11/1978 | Goetze et al. | 29/417 |
| 4,536,233 | 8/1985 | Okonogi et al. | 148/101 |

OTHER PUBLICATIONS

"Critical Current Density of Wire Type Y—Ba—Cu Oxide Superconductor," by Yamada et al. (May 1987).
Ikeno et al., "Characterization an Superconducting Properties of Y—Ba—Cu—O Wire", *Matls. Research Society*, 1989.

(List continued on next page.)

*Primary Examiner*—James Lowe
*Assistant Examiner*—Christopher A. Fiorilla
*Attorney, Agent, or Firm*—Oblon, Spivak, McClelland, Maier & Neustadt

[57] ABSTRACT

A method of producing a superconductor including a superconductive oxide. At least one material is pressed for forming a filling material, the at least one material being selected from the group consisting of a starting material powder of the superconductive oxide, a powder of the superconductive oxide and a compact made of the starting material powder and/or the superconductive oxide powder, for forming a filling material. The filling material is charged into a metallic pipe to form a preform. The preform is moved along an axis thereof. During moving, the preform is swaged perpendicularly to the axis thereof to form a composite having a metallic sheath, made of the metallic pipe, and a core sheathed with the metallic sheath. The core of the composite is heated for producing the superconductive oxide.

27 Claims, 6 Drawing Sheets

OTHER PUBLICATIONS

Kohno et al., "Characteristics of High-$T_c$ Oxide Wire", Physica B (1987).

Ikenu et al., "High Field Properties and Characteristics of Oxide Superconductors", Physica B (1989).

Kohno et al., "High Critical Current Density of Y—Ba—Cu-Oxide Wire Without a Metal Sheath", *Jap Journ of App Phys* (1988).

Kohno et al., "Critical Current Density of Y—Ba—Cu-Oxide Wires", *Jap Journ of App Physics* (1987).

Kohno et al., "Critical Temperature and Critical Current Density of La—Sr—Cu Oxide Wires", *Jap Journ App Phys* (1987).

Sadakata et al., "Fabrication and Superconducting Properties of High $T_c$ Oxide Wire", *Matls Research Soc* (1988).

Nikkei Industrial News of Japan, May 19, 1987 (no translation provided).

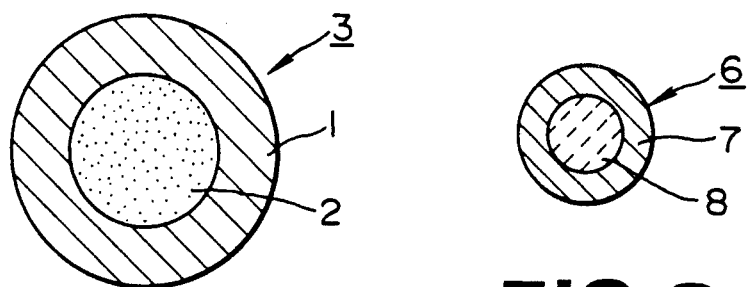
FIG.1
FIG.3
FIG.6
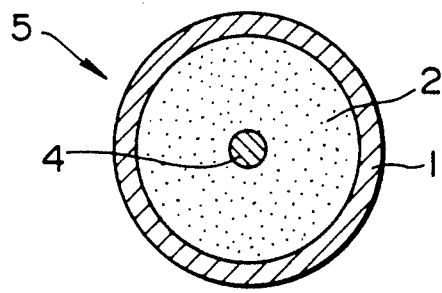
FIG.2

METHOD OF PRODUCING A SUPERCONDUCTIVE OXIDE CONDUCTOR

BACKGROUND OF THE INVENTION

Intense efforts, in research and development are directed toward superconductive oxides for practical use, for example, magnet coils of the nuclear magnetic resonance imaging apparatus, magnet coils of the particle accelerator, the power transmission line and a like use. The present invention relates to a method of producing an oxide superconductor, which exhibits excellent superconductivity and high mechanical strength as compared to the superconductor produced by the prior art method, and an oxide superconductor produced by the method.

Recently, various superconductive oxides with high critical temperatures (Tc) have been discovered. For producing superconducting wires including such superconductive oxides, for example, Y-Ba-Cu oxide, there has been proposed that a powder mixture which includes $Y_2O_3$ powder, BaO powder and CuO powder is charged into a metallic pipe, which is then diameter reduced to form a composite wire, which is in turn heat treated for a solid-state reaction so that the superconductive oxide is produced in the core. According to such a method, it is difficult to provide a high forging ratio without breaking of the composite wire. Thus, the core, having an insufficient green density, of the composite wire has a tendency that during heat treatment thereof, solid phase reaction does not take place sufficiently and hence excellent superconductivity is not obtained. Further, when sintered, a core of such an insufficient green density provides a relatively large porosity of superconductor, which is poor in mechanical strength and is liable to produce cracks in it when it is wound around a magnet core, the cracks considerably degrading superconductivity thereof.

Accordingly it is an object of the present invention to provide a method of producing a superconductor, in which the green density of the compact, is raised fairly high as compared to the prior art method, and which thus exhibits excellent superconductivity and high mechanical strength as compared to the superconductor produced by the prior art method.

SUMMARY OF THE INVENTION

With this and other objects in view, the present invention provides a method of producing a superconductor without a metallic sheath, the superconductor including a superconductive oxide. The superconductive oxide is represented by the formula

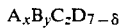

provided that the A is at least one selected from the group consisting of Sc, Y, La, Ce, Pr, Nd, Pm, Sm, Eu, Gd, Tb, Dy, Ho, Er, Tm, Yb and Lu, the B is at least one selected from the group consisting of Be, Sr, Mg, Ca, Ba and Ra, the C includes Cu, the D includes O, about $0.1 \leq x \leq$ about 2.0, about $1 \leq y \leq$ about 3, about $1 \leq z \leq$ about 3, $0 \leq \delta \leq 5$, or by the formula

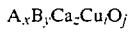

provided that the A includes Bi or Tl, the B includes Sr or Ba, about $1 \leq x \leq$ about 3, about $1 \leq y \leq$ about 3, about $0 \leq z \leq$ about 3 and about $0 \leq i \leq$ about 4. A filling material is charged into a metallic pipe for forming a preform. The filling material is at least one material selected from the group consisting of a starting material powder of the superconductor, a powder of the superconductor and a compact made of the starting material powder and/or the superconductive powder. The preform is reduced in cross-sectional area for forming a composite including a core, made of the at least one filling material, and a metallic sheath covering the core. The metallic sheath of the composite is removed for exposing the core. The exposed core is heat treated for producing the superconductive oxide. The superconductor of the present invention may be in the form of a wire, multifilamentary, wire, cable, ribbon, bulk shape and other like configurations.

Another aspect of the present invention is directed to a superconductor produced by the method above mentioned.

BRIEF DESCRIPTION OF THE DRAWINGS

In the drawings:

FIG. 1 is an larged cross-sectional view of a preform according to the present invention;

FIG. 2 is an enlarged cross-sectional view of a modified form of the preform in FIG. 1;

FIG. 3 is an enlarged cross-sectional view of a composite wire produced by diameter reducing the preform in FIG. 1;

FIG. 6 is an enlarged cross-sectional view of the core obtained by removing the sheath of the composite in FIG. 3;

DETAILED DESCRIPTION OF THE INVENTION

The superconductive oxide

Figure 4:
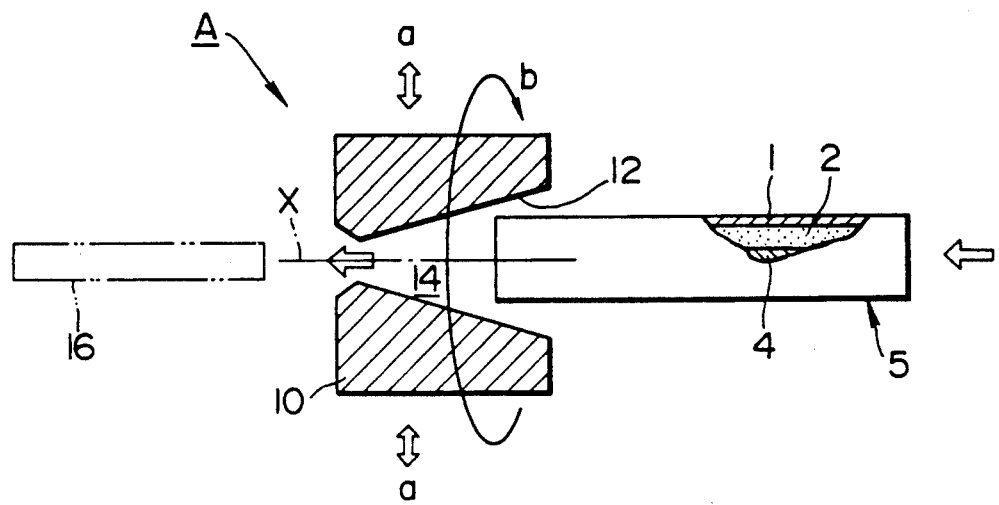
FIG. 4 is a diagrammatic illustration of a rotary swaging machine, in which a composite wire of the preform in FIG. 2 is introduced.

In the $A_xB_yC_zD_{7-\delta}$ superconductor of the present invention, the C may include Cu or Cu plus at least one element among Ag, Au and Nb and the D may contain O or O plus at least one element among S, Se, Te, Po, F, Cl, Br, I and At. Specific examples are: $Ba_{0.1}Sr_{0.05}La_{1.5}Yb_{0.35}CuO_{3.2}F_{0.8}$; $Ba_{0.1}Sr_{0.05}La_{1.5}Yb_{0.35}Cu_{0.9}Ag_{0.1}O_{3.2}F_{0.8}$; and $Ba_{0.1}Sr_{0.05}La_{1.5}Yb_{0.035}Cu_{0.9}Au_{0.1}O_{3.2}F_{0.8}$. In $Y_xBa_yCu_zO_{7-\delta}$ superconductor, preferably $x=1, y=2, z=3, 0<\delta<1$, typically $\delta$ is about 0, and the oxide superconductor is orthorhombic. In $La_{2-k}B_kCuO_4$, preferably $0<k<0.3$ and typically, $k=0.15$. Typical examples of the $A_xB_yCa_zCu_iO_j$ are $Bi_2Sr_2Ca_2Cu_3O_j$, $Bi_2Sr_2Ca_1Cu_2O_j$, $Tl_1Ca_2Ba_3Cu_4O_j$, $Tl_2Ca_2Ba_2Cu_3O_j$, $Tl_2Ca_2Ba_1Cu_3O_j$. Other typical examples of the superconductive oxide according to the present invention are $La_2Cu_1O_{4-m}$, $BaKBiO_3$, and $BaPbBiO_3$.

The filling material

The filling material according to the present invention may include: a starting material power, including the elements which constitute the oxide superconductor; a green compact of such a starting material power; calcined green compact of the starting material powder; and a superconducting material obtained by sintering the green compact or by pulverizing the sintered compact. The filler may be in the form of powder, granule, compacted body of such a material or a mixture thereof.

The starting material powder may contain: for example, a mixture of a powder of the A element or elements, a powder or a carbonate of the B element or elements, and a powder of the C element or elements; a pulverized, calcined powder of such a mixture; or a like powder. The powder of IIIa group elements, Sc, Y, La, Ce, Pr, Nd, Pm, Sm, Eu, Gd, Tb, Dy, Ho, Er, Tm, Yb and Lu, may be in the form of a powder of a compound such as a carbonate, oxide, chloride, sulfide, oxalate and fluoride thereof and in the form of an alloy powder thereof. As the IIIa group powder, an, oxide powder thereof with a particle size about 5 $\mu m$ or smaller is preferably used. The powder including Bi may be a powder of an oxalate thereof and the powder containing Tl may be a powder of $Tl_2O_3$. The powder of IIa group elements, may be in the form of a powder of a compound such as a carbonate, oxide, chloride, sulfide, oxalate and fluoride thereof and in the form of an alloy powder thereof. As the IIa group powder, a carbonate powder thereof with a particle size about 3 $\mu m$ or smaller is preferably used. The powder containing copper may be a powder of a copper oxide including CuO, $Cu_2O$, $Cu_2O_3$ and $Cu_4O_3$. A CuO powder of a particle size of about 3 $\mu m$ or smaller is preferably used. The mixing ratio of these compounds depends on a desired superconductor. For $Y_1Ba_2Cu_3O_{7-\delta}$, $Y_2O_3$, $BaCO_3$ and CuO powders are preferably mixed so that Y: Ba: Cu = 1: 2:3 at mole ratio. The starting material powder may have a particle size of about 4 $\mu m$ or smaller, preferably about 1 to about 2 $\mu m$. Within such a preferable range, excellent heat diffusion of elements of the superconductive oxide may occur.

The starting material powder for the A-B-Cu-O superconductor may be prepared by the following so-called solgel method. An aqueous solution of the A element, the B element and Cu is prepared by weighing a soluble salt, such as a nitrate and acetate, of these elements at predetermined ratio, and then by dissolving them into a predetermined amount of water. The total concentration of the salts of these elements in the aqueous solution is preferably about 0.5 to about 10 wt.% but it depends on the kind of the soluble salt. Such an aqueous solution may be prepared by dissolving an oxide or carbonate of each element by an aqueous solution of nitric acid or acetic acid. Then, an acid, preferably carboxylic acid such as citric acid, succinic acid and tartaric acid, is added to the aqueous solution of the elements. About 5 to about 20 wt.% of citric acid is used per 100 wt.% of the aqueous, solution. The amount of the other acids depends on the kind thereof. The acid added aqueous solution is then neutralized by adding a basic material, such as ammonia, ammonium carbonate, guanidine and ammonium acetate, to obtain a neutralized aqueous solution of about pH 7. As the basic material, an aqueous ammonia is preferably used. Then, the neutralized aqueous solution is heated to evaporate water and further to decompose or pyrolize the acid material and basic material, so that a solid sponge material (mixture) of oxides or carbonates, such as $Y_2O_3$, $BaCO_3$ and CuO, of each element of the oxide superconductor is obtained. Subsequently, the sponge material is heated for burning and is then pulverized by a ball mill or automatic mortar for a predetermined particle size. The burnt sponge material is an aggregate of fine particles with a particle size of about 0.1 to about 0.6 $\mu m$ and hence it is easy to produce fine powder mixture of a particle size of about 0.1 to about 0.6 $\mu m$ by pulverizing. The fine powder is calcined as described hereinafter.

An alternative method for preparing the starting material is the following so-called coprecipitation method, in which an aqueous solution of the elements is prepared in the same manner as the sol-gel method above-described. A precipitant, such as oxalic acid, potassium oxalate, potassium carbonate and sodium carbonate, is added to the aqueous solution. The amount of the precipitant depends on its kind. Precipitation is carried out by controlling pH of the aqueous solution by adding a basic material, such as an aqueous ammonia, ammonium carbonate and potassium hydroxide. When oxalic acid is used as the precipitant, pH is set to about 4.6 and when potassium carbonate is used, it is controlled to about 7 to about 8. The coprecipitate is heated at about 100 to about 200° C., preferably about 150° C., for drying and then it is calcined about 700° to about 900° C. for about 50 hours in a flowing oxygen atmosphere preferably including about 90 vol. % or more of oxygen. Then, the calcined material is pulverized by a ball mill or a mortar for a predetermined particle size of the starting material powder.

The filling material may be calcined at about 500° to about 1000° C. for about 1 to about 100 hours in an oxygen atmosphere, including oxygen gas with an oxygen purity of 90% or more, preferably nearly 100%, for removing carbonates and carbon which are contained in it. When the high purity oxygen gas is forced to flow within the calcining furnace without standing, no significant problems are encountered but preferably, the flow rate is about 40 cm/min or more. The calcining may be repeated if necessary. Subsequently, the calcined filling material may be pulverized for a predetermined particle size, for instance, with a ball mill, mixed and then pressed into a bar-shaped compact by conventional methods, for example, cold hydrostatic pressing, such as rubber pressing using a rubber shell and hot hydrostatic pressing, for providing a predetermined green density. The compacting pressure may be about 1.5 to about 10 metric tons/cm², preferably about 1 to about 5 metric tons/cm² although it depends on the kind of the calcined material and on the predetermined green density. The calcining, the pulverizing and pressing operations may be repeated. With such operations, a green density of the compact may be 60% or more of the theoretical density which has zero porosity. It is preferable to obtain a compact of a green density about 70% or more of the theoretical density.

The calcined, pulverized filling material may be charged into a rubber tube, having one closed end, which is evacuated in a vacuum chamber to a vacuum level, for instance, about $10^{-4}$ mmHg, for reducing blowholes in the core heat treated and then is sealed by closing the other open end also in the vacuum chamber. The sealed tube may be wrapped with a soft synthetic resin sheet such as of a polyvinyl chloride resin for enhancing sealing thereof. Then, the rubber tube, wrapped with the synthetic resin, is pressed by means of a hydrostatic rubber press machine to form a compact in the same manner as in the forming of the bar-shape compact above described. The compact thus prepared has little air holes and hence has a relatively high green density and little cracks. This compact may be subject to the subsequent intermediate sintering described below. Then, the compact may be heated at about 700° to about 1100° C. for about 1 to about 100 hours, preferably at about 800° to about 1000° C. and more preferably at about 850° to about 950° C. for about 1 to about 50 hours, in an oxygen atmosphere. With such an intermediate sintering, the sintered compact may have a sintered density of about 75% or more of the theoretical density. This sintered density of about 75% or more provides preferable sintered density, that is, about 82% or more, of the sintered core of the composite wire by a heat treatment with ease after subsequent forging or cross-sectional area reduction which will be hereinafter described.

When the sintered density of a sintered compact which has been subjected to the intermediate sintering is set to about 70% to about 75%, the diameter reduced core thereof may have a green density of about 75% to 85% of the theoretical density which provides a sufficient amount of oxygen to the inside of the core 22 having no sheath during subsequent heat treatment for producing a superconductive oxide, so that the sintered core having an excellent superconductivity may be produced with a sintered density of about 90% or more of the theoretical density.

The filling material of the superconductive material may be prepared by calcining the starting material powder at about 500° to about 1000° C. for, about 1 to about 50 hours, pressing the calcined powder to form a compact in a similar manner above described, and then heating the compact for about 700° to 1100° C. for about 1 to about 100 hours in an oxygen atmosphere or oxygen-containing atmosphere, which will be stated in more detail in paragraphs entitled "The heat treatment", for producing a superconductive oxide. For Y-Ba-Cu oxide superconductor, the compact is heated preferably for about 800° to about 1000° C. for 1 to about 50 hours. Thereafter, the heat treated compact is pulverized to obtain a predetermined particle size of the superconducting material powder. These pressing, heating and pulverizing operations may be repeated for producing a superconducting material powder of a homogeneous composition. The superconducting material powder is selected with a conventional method, such as sedimentation, to have a particle size of, typically, about 1 μm or smaller and preferably about 0.7 μm to about 1.5 μm. The superconducting material powder thus selected may be pressed and then subjected to intermediate sintering in the same manner as previously described.

The metallic pipe

The metallic pipe according to the present invention may be made of, for example, copper, a copper alloy, a noble metal such as silver, gold and platinum, an alloy of such a noble metal, aluminum and a stainless steel. The pipe may be made of other metals or plastic materials other than metals. When the metallic sheath is not removed after the cross-section reduction of the preform and the composite is directly subjected to the heat treatment hereinafter described in detail, the pipe should be made of an unoxidizing material which does not take oxygen away from the core of the composite during heat treatment for producing an oxide superconductor. For this reason, noble metals above-mentioned or alloys containing noble metals, are preferably used, but use may be made as the pipe a pipe, made of any oxidizing material, which is coated at its inner face with an coating of such an unoxydizing material or a like material for preventing oxygen from being taken away during the heat treatment.

The thickness of the metallic pipe is preferably about 10 to about 25% of the outer diameter thereof. The lower limit of the thickness of the metallic pipe should be such that it does not produce a breaking of the diameter reduced composite wire having a predetermined diameter. The upper limit is determined in view of both the pressure transmittance to the core and the cost of the metallic pipe.

The preform

The filling material is charged into the metallic pipe to form a preform. FIG. 1 illustrates a preform 3 which may be, according to the present invention, prepared by inserting a compact 2, made of a superconductor powder,, into the metallic pipe 1. The compact 2 may be made by pressing and then sintering a green compact of the superconducting material into a cylindrical shape. The temperature of the sintering may be about 400° to about 1000° C. The compact 2 may be made with a rubber shell in a conventional hydrostatic press machine. It is preferable that the gap between the compact 2 and the metallic pipe 1, which fits around the compact 2, is as small as possible so that forging pressure may be sufficiently applied to the core compact in the subsequent diameter reduction.

As illustrated in FIG. 2, the filling material 2 may be, according to the present invention, charged into a metallic pipe 1 into which a core wire 4 is concentrically arranged to form a preform 5. The core wire 4 is made of a non-oxidizing material which does not take oxygen away from the filling material 2 in the metallic pipe 1 during the subsequent heat treatment. The core wire 4 should have a high tensile strength with a melting point higher than about 800° C. and may include, for example, a metal wire, such as of silver, gold, platinum, titanium, tantalum and a silver alloy, and a ceramic fiber such as a carbon fiber, silica fiber and alumina fiber. The cross-sectional area of the core wire 4 has preferably about 10% or less of the cross-sectional area of the filling material 2 charged in the metallic pipe 1. With about 10% or less, the core wire 4 provides excellent effects to the superconductor in raising green density of the core of the composite wire and in mechanical strength thereof.

The diameter reduction

In the present invention, the preforms 3 and 5 may be conventionally diameter reduced and formed into a composite wire 6 by well-known methods, for example, drawing with a die, rolling with grooved rolls or swaging such as rotary swaging, to a predetermined diameter. The diameter reduced composite wire 6 has a metallic sheath 7 and a core 8 sheathed with the sheath 7. The diameter reduction operation may be repeated. It is preferable that the forging ratio F is within a range about 10% to about 40% for each diameter reduction operation in which F is defined by the formula $$F = (S_1 - S_2) \times 100/S_1$$

where $S_1$ and $S_2$ are cross-sectional area of the preform 3, 4 and the diameter-reduced preform or composite wire 6, respectively. Below about 10% of the forging ratio F, the number of the diameter reduction operation is rather increased. Beyond about 40%, it takes rather long period of the processing time.

The preforms 3 and 4 are preferably diameter reduced by rotary swaging using a conventional rotary swaging machine A as in FIG. 4, in which a plurality of dies 10 are arranged about an axis X thereof and are forced to be axially moved (in the direction of the arrow a) during rotating about the axis X (in a the direction of the arrow b). The rotary swaging machine A is arranged so that the dies 10 surround the traveling path of the preform 5. The dies 10 are supported to be movable perpendicularly to and to be rotatable about the traveling path. Each of the dies 10 has an inclined face 12 inclined to the axis X so that the inclined faces 12 thereof define a substantially conical working space 14 tapering forwards.

In diameter reduction, the rotary swaging machine A is actuated and then one end of the preform 5 is pushed into the tapering working space 14 of the rotary swaging machine A along the traveling path thereof. The preform 5 is diameter reduced from its one end by the dies 10, which are radially reciprocated and rotated about the axis X, and it is thereby shaped into a composite wire 16 and hence the rotary swaging provides a fairly large forging ratio to the preform 5 as compared to other conventional forging methods. In this rotary swaging machine A, the processing speed or the traveling speed of the preform 3, 5 through it is preferably about 0.1 m to about 10 m/min.

Figure 5:
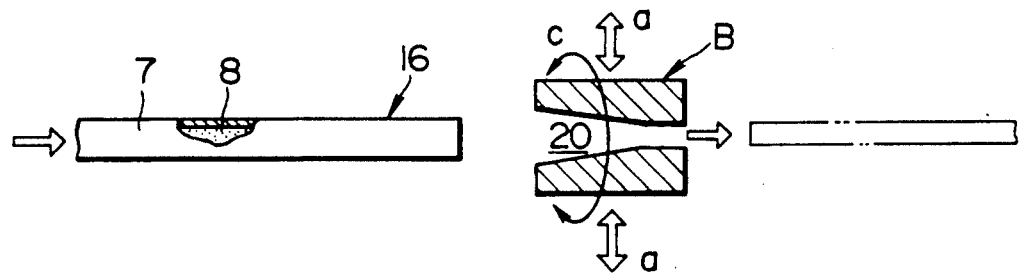
FIG. 5 is a diagrammatic illustration of another swaging machine for further swaging the composite wire processed in the swaging machine in FIG. 4.

When needed, the composites 6, 16 may be further diameter reduced to a predetermined diameter by means of another rotary swaging machine B in FIG. 5 which has a conical working space 20 smaller than that of the first rotary swaging machine A. In this second diameter reduction, the composite 6, 16 is swaged from the other end to the one end while in the first diameter reduction, it has been diameter reduced from the one end to the other end. Such change in the swaging direction along the axis X provides an increase in green density of the core 8 in the sheath. The swaging operation may be repeated more than twice, in which case the direction of swaging may be changed in each operation or with intervals of a predetermined number of swaging.

The composite wire 6, 16 undergoes the rotary swaging until the green density of the core 8 reaches to about 75% or more, preferably to about 77% or more of the theoretical density. With the green density of less than about 75%, superconductivity of the produced oxide superconductor may be degraded since there is an upper limit of increase in density of the core in the subsequent heat treatment, which will be described hereinafter. The core of composite wire 6, 16 may have a green density of about 75% or more by other conventional methods such as die forging.

The removal of the metallic sheath

The metallic sheath may be, according to the present invention, removed form the composite. diameter reduced, to expose the core 22 thereof to the atmosphere as illustrated in FIG. 6.

The removal of the metallic sheath may be, according to the present invention, carried out by dipping the diameter reduced composite into a solution of an acid or an alkaline, as a treating liquid, for dissolving the sheath. More specifically, a strong acid such as dilute nitric acid may be used for dissolving a metallic sheath made of silver, copper or their alloy.

When an alkali soluble metal which is soluble in an alkali solution is used for the metallic sheath, an aqueous solution of an alkali, such as sodium hydroxide, potassium hydroxide, calcium hydroxide, sodium carbonate and potassium carbonate, may be adopted as the treating liquid. When aluminum is used for ,the sheath an aqueous solution of an alkali, such as sodium hydroxide, may be used. Conditions of removing of the metallic sheath depend on the material thereof. When aluminum or its alloy is used for the sheath, removal thereof may be carried out at room temperatures. When iron or its alloy is used, the metallic sheath is heated, during which it is treated with a concentrated aqueous solution of an alkali, such as sodium hydroxide in the presence of oxygen. Aqua regia may be used for dissolving a metallic sheath of a stainless steel. Hydrochloric acid may be used as the treating liquid according to the material of the metallic sheath.

For preventing impurities from entering into the superconductor and the manufacturing facility from being corroded from the treating liquid, it is preferable to wash the exposed core 22 with water or to neutralize the treating liquid, adhered to the exposed core 22, after washed with water.

In the present invention, the metallic sheath may be machined for removing it, but care should be taken not to break or damage the brittle core 22 particularly when the wire 6 is fine.

Figure 7:
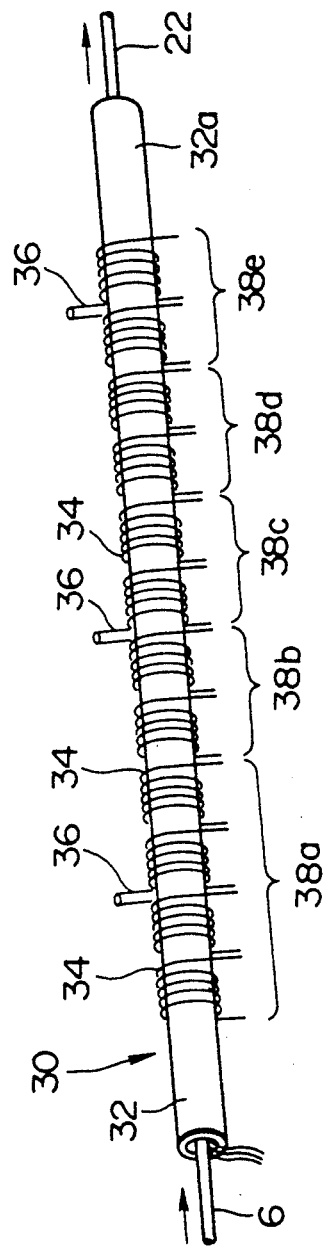
FIG. 7 is a perspective view of the induction heating appliance used in one preferable mode of the present invention.

Alternatively, the metallic sheath may be, according to the present invention, removed by high frequency induction heating to expose the core 22 and continuously the exposed core 22 may be heat treated for producing the oxide superconductor. In this removing method, the diameter reduced composite 6, 16 may be continuously introduced, as illustrated in FIG. 7, into a heating tube 30 having a glass tube 32, made of a heat-resisting glass, silica glass or a like glass, with an inner diameter of about 10 to 20 mm and length of about 40 m. The glass tube 32 is arranged in an inclined manner such that the inlet of thereof is lower than the outlet thereof as shown in FIG. 7 so that a molten metal may flow out of the inlet. The heating tube 30 has high frequency induction heating coils 34, wound around the glass tube 32, and is provided with a plurality of, three in this embodiment, oxygen supply tubes 36 mounted to the glass tube 32 to communicate to the inside thereof. Thus, there are provided five heating zones, that is, a first heating zone 38a, second heating zone 38b, third heating zone 38c, fourth heating zone 38d and fifth heating zone 38e from the inlet to the outlet. High frequency current of about 5 kHz to about 500 kHz is supplied from a power source to respective coils 34 to provide outputs of about 1 kW to about 100 kW. In this heating tube, high frequency current of 25 kHz is supplied to the first, second, third, fourth and fifth heating zones 38a-38e to yield outputs of 30, 10, 5, 1 and 1 kW, respectively. The length of the first heating zone 38a is about 10 m and the length of each of the other heating zones 38b-38e is about 5 m. When the composite 6, 16 is introduced into the energized first heating zone 38a of the heating tube 30, eddy current is generated in the metallic sheath 7, so that the latter is melted and removed from the composite 6, 16 to thereby expose the core 8. In this event, no substantial eddy current is generated in the core 8 since it has a volume resistivity of $10^{-3}$ to 1 $\Omega \cdot$cm and hence it gradually heated by dielectric loss. Then the core 8 is subsequently moved to the second to fifth heating zones 38b to 38e. Since outputs of the heating zones 38a to 38e are gradually reduced, the core 8 is heated at the highest temperature, in this heating tube 30, of about 900° C. and then gradually cooled. The speed of the slow cooling depends on the output and the length of each heating zone 38a-38e and traveling speed of the core 8 in the heating tube 30. For preventing cracks from occurring due to rapid cooling, it is preferable to gradually cool the core 22 at a speed of about −50° to about 400° C. This induction heating is from about 900° C. to about 400°C. This induction heating is carried out in an oxygen atmosphere. More specifically, hot oxygen gas which is previously heated is introduced into the glass tube 32 through the oxygen supply tubes 36 to form the oxygen atmosphere, in which the exposed core 22, from which the metallic sheath 7 has been removed, is induction heated and then gradually cooled by the high frequency induction heating coils co that an oxide superconductor with fine crystal structure is produced. In case of production of Y-Ba-Cu-O superconductor, the transformation from a cubic system to a rhombic system thereof may be smoothly carried out with this heating tube 30. Then, the exposed core 22 is pulled out of the heating tube 30 and is preferably cooled at a speed of about −50° to about −500° C./hour for preventing cracks from being produced due to rapid cooling. The slow cooling may be carried out in a furnace using a conventional heater without use of the second to fifth heating coils 38b-38e. The core 22 which is issued out of the heating tube 30 may be further heat treated for annealing.

The molten metal of the metallic sheath 7 may be transported to the outside of the heating tube 30 by arranging the latter in an inclined manner so as to discharge it by gravity. Alternatively, a molten metal receiving tape may be introduced into the heat tube 30 so that it passes just below the composite 6 for receiving the molten metal of the metallic pipe 7 and then, the tape is pulled outside to issue out from the heat tube 30 for recovering the molten metal.

Figure 8:
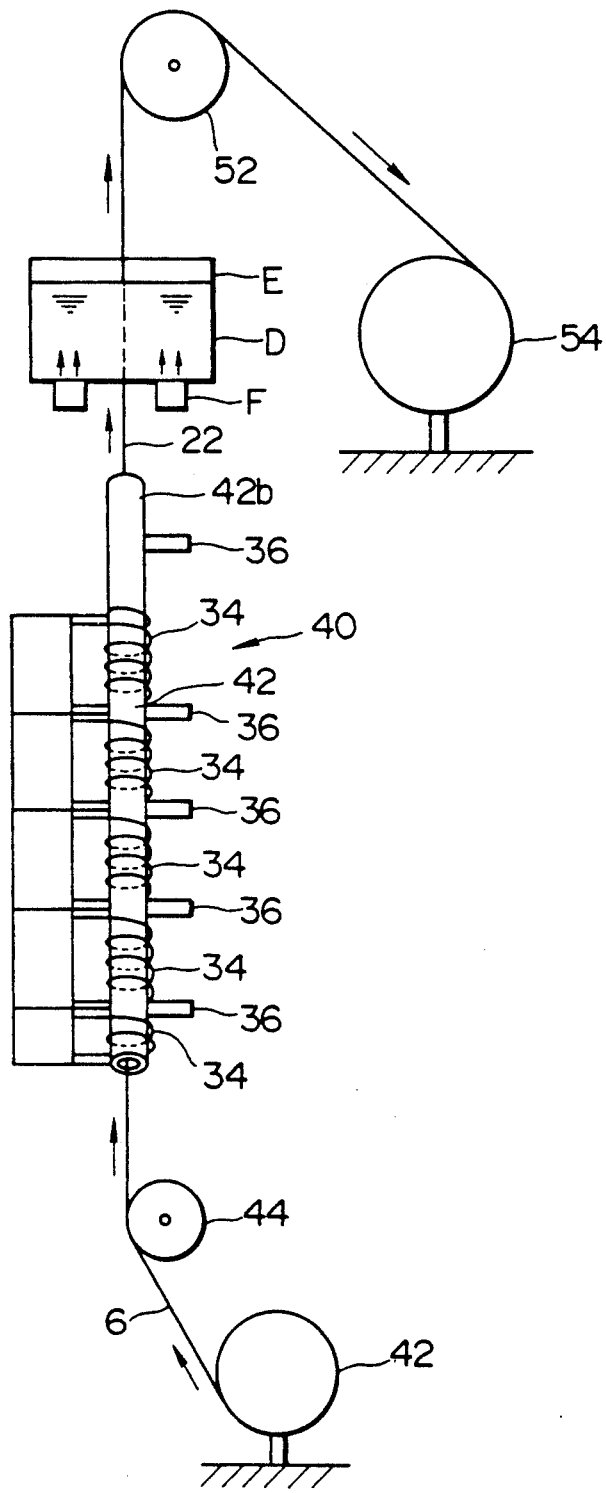
FIG. 8 is a diagrammatic illustration of a modified form of the induction heating, appliance in FIG. 7.
Figure 9:
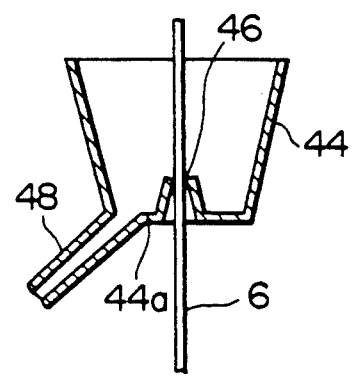
FIG. 9 is an enlarged receptacle for recovering a molten metal in the heating appliance in FIG. 8.

A modified form of the heating tube 30 in FIG. 7 is illustrated in FIG. 8 in which another heating tube 40 is vertically arranged. The composite wire 6 is pulled out from a reel 42 and is then introduced via a roller 44 into the vertical heating tube 40. The wire 6 or the core 22 concentrically passes through the heating tube 40, where the metallic sheath 7 is melted at heating zones and then the exposed core 22 is gradually cooled at the slow cooling portion 42b at an appropriate speed of about −50° to about −500° C./hour. The molten metal falls to the bottom of the heating tube 40 where it is preferably collected in a cup 44 (FIG. 9) coaxially located just below the heating tube 40 although the cup 44 is not illustrated in FIG. 8. The composite wire 6 is pulled upwards and coaxially passes the cup 44 through a hole 46 formed through the bottom thereof. The cup 44 has a discharge pipe 48 jointed to its bottom 44a for discharging the collected molten metal to the outside. The exposed core 22 which has issued from the heating tube 40 is subjected to dip forming at a bath E for forming a coating 50 (FIG. 10) and then is wound via a roller 52 around a winding reel 54. In this heating tube 40, the wire 6 and the core 22 vertically passes through the heating tube 40 and hence it is kept vertically without excessive tension for pulling it. This is more preferable for preventing cracks due to tension from occurring than in the heating tube 30 in FIG. 7 where the wire 6 and the core 22 should be kept tight not to touch the inner face of the heating tube 30.

The heat treatment

After the metallic sheath 7 is removed, the exposed core 22 may, according to the present invention, undergo the heat treatment outside the heating tubes 30, 40 to produce a superconductive oxide without being subjected to the heat treatment within the heating tubes. The heat treatment may be made in an oxygen atmosphere with oxygen content of about 90 volume % or more at about 800° to about 1100° C. for about 1 to about 500 hours. This heat treatment is preferably carried out at about 850° to about 920° C. for about 1 to about 100 hours. Below about 850° C., it takes a considerable time to increase the sintered density and above about 920° C., the crystal grain of the oxide superconductor is liable to have a columnar structure and hence clearances between crystal grains may become relatively large, so that the sintered density may decrease. For producing a Y-Ba-Cu oxide superconductor, after the heat treatment the core is preferably gradually cooled at −100° C./hour and may be maintained at about 400° to about 600° C. for about 5 to about 50 hours for transforming a cubic system to a rhombic system of the crystal structure during the slow cooling. With the oxygen concentration of about 90 volume % or more, excellent superconductor may be produced. The purity of the oxygen gas is preferably about 90% or more and flow rate of such high purity oxygen gas may be about 0.5 to about 5 liters/min. The heat treatment may be carried out in a pressurized atmosphere, in which the pressure of oxygen gas is preferably about 1.5 to about 5 atmosphere. The core 8 becomes an excellent oxide superconductor since it is exposed to the oxygen atmosphere and is supplied with a sufficient amount of oxygen from the atmosphere. Furthermore, the metallic sheath is removed from the core 8 during the heat treatment, and hence any crack due to stresses which may be caused by the difference in thermal expansion coefficient between them occurs. When the preform is subjected to the rotary swaging as previously described so that the green density of the core 8 reaches to about 75% or more of the theoretical density, the sintered density of the heat treated core 22 may become about 90 to about 95% of the theoretical density, which provides an excellent superconductivity to the finished superconductor. When the green density of the core of the composite is 82% or more, then the sintered density of the heat treated core may be about 91% or more.

Instead of the oxygen atmosphere, other gases, such as an oxygen gas mixture including, VIb group gas, such as S, Se, Te or Po gas other than oxygen gas, VIIb group gas, such as F, Cl or Br, or an inert gas, such as He, Ne, Ar, Kr, Xe or Rn gas, may be used for the heat treatment. With these gas mixture atmospheres, such elements may diffuse into the core and hence the heat treated core has at its surface portion a superconductive oxide having a uniform superconductivity along its axis. Thus, excellent oxide superconductor may be produced.

The coating treatment

Figure 10:
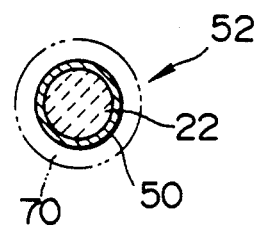
FIG. 10 is an enlarged cross-sectional view of a superconductor coated according to the present invention.

After the heat treatment, the core 22 may be subjected to a coating treatment during application of ultrasonic waves and thereby a superconducting wire 52 having the core 22 coated with the coating layer 50 is obtained as illustrated in FIG. 10. The coating layer 50 may have a thickness about $-5$ $\mu$m to about 100 $\mu$m, and preferably about 10 $\mu$ to about 50 $\mu$m. The coating treatment may be made by electroplating, hot dipping and similar coating of: a solder, such as of an alloy of zinc and copper and an alloy of tin and lead; a low melting point metal, such as aluminum, tin, zinc, lead, indium, gallium and bismuth, an alloy thereof; and a synthetic resin such as a polyimideamide resin, formal, Teflon resin, nylon and polyvinyl chloride. Metals, such as aluminum, having low electric resistance at liquid nitrogen temperature are preferably used for the coating metal. The metallic coating layer of such metals may be used as a stabilizing layer of the superconductor. Another specific coating technique is that a powder of such low melting point metals or their alloys is adhered to the surface of the heat treated core 22 to form a coating, which is then sintered. With the coating 50, elements, such as oxygen, of the superconductive oxide are prevented from leaving it and are protected from foreign materials such moisture. Thus, the coating 50 maintains excellent superconductivity for a fairly long period of time. The melting temperature, of the solders and low melting metals are below about 800° C., preferably below the temperature at which the crystal structure of the superconductive oxide in the core may be affected.

Figure 11:
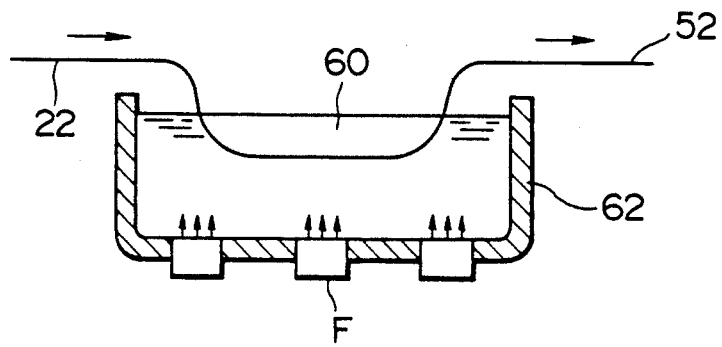
FIG. 11 is an illustration of a hot dipping process used in one preferred mode of the present invention.

FIG. 11 illustrates a hot dipping process, in which the core 22, heat treated, may be continuously passed through a molten solder 60, such as of an alloy of zinc and copper or an alloy of tin and lead, in a treating bath 62, and after a predetermined period of time, it is taken up from the bath 62 and cooled to solidify the solder 60 adhered to the core 22, so that a superconducting wire 52 having a predetermined thickness of coating layer is produced. An ultrasonic wave generator 64 may be mounted to the bath 62 for applying ultrasonic waves through the molten solder 60 to the core 22 passing through it. By applying ultrasonic waves, air or other substances adhered to the core 22 is removed from it for improving wettability thereof, so that the solder 60 is strongly bonded to the core. Ultrasonic waves having a frequency of about 5 kHz to about 200 kHz are preferably used.

The coated oxide superconducting wire 52 may further undergo a plating treatment for coating the coating layer with a metallic layer 70, made of tin, copper or a like metal, to reinforce the core 22 as in FIG. 10.

Figure 12:
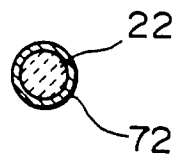
FIG. 12 is an enlarged cross-sectional view of a heat treated core coated with a buffer layer according to the present invention.
Figure 13:
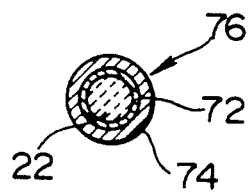
FIG. 13 is a cross-sectional view of the coated core in FIG. 12 sheathed with a metallic sheath.

As illustrated in FIG. 12, the heat treated core 22 may be coated with a buffer layer 72 for reducing thermal stresses which are produced in it when it is cooled at liquid nitrogen temperature. In this case, the coating layer and metallic layer are omitted. The buffer layer 72 may be made of a substance which is intermediate in coefficient of thermal expansion between the heat treated core 22 and the a metallic sheath 74 which will be described later. The metals or alloys above mentioned may be used for the buffer layer 72. The buffer layer 72 may be, formed by winding a tape, made of such materials, around the heat treated core 22 or placing it to surround the core so that the tape extends along the axis thereof. Hot-dipping, vapor deposition and dip forming may be also adopted for forming the buffer layer 72. The metallic sheath 74, such as of aluminum and copper, may be formed around the buffer layer 72 to form a sheathed superconductor wire 76. The metallic sheath 74 may be formed by covering the buffer layer 72 with a tube, made of a tape or a thin plate, by means of a conventional sheath forming method using dies or forming rolls without forming a gap between the metallic sheath 74 and the buffer layer 72. The superconducting wire 76 thus fabricated may be wound around a core of a superconducting magnet as a coil or may be used for power transmission.

Production of multifilamentary superconductors

Figure 14:
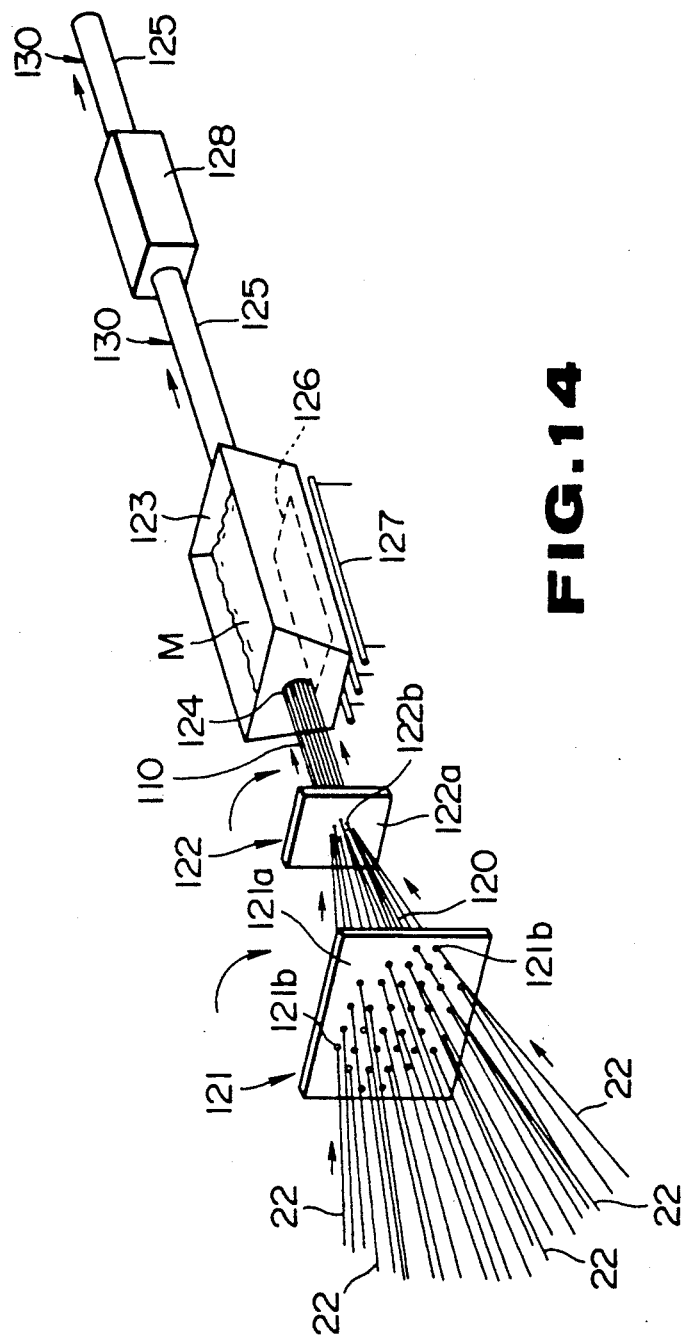
FIG. 14 is a perspective view of an apparatus for producing a multifilamentary superconductor according to the present invention.
Figure 15:
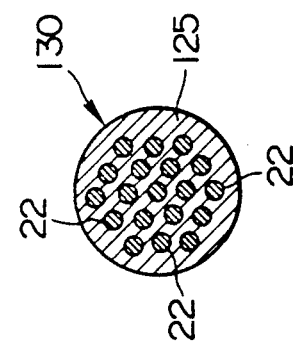
FIG. 15 is an enlarged cross-sectional view of the multifilamentary superconductor produced by the apparatus in FIG. 14.

A plurality of, several tens, coated superconductors 52 are arranged through respective holes 121b which are formed through a first separator 121 with regular intervals as shown in FIG. 14. The first separator 121 makes the coated superconductors 52 straight and places them in parallel to each other. Then, the superconductors 52 pass through holes 122b formed through a second separator 122 with predetermined regular intervals for arranging them in a bundle 110 with predetermined regular intervals, which this then passes through a molten metal bath 123, which contains a molten metal M which is the same kind of metal as the coating metal 50 hereinbefore mentioned. The superconductors 52 enter the bath 123 sealingly through bushings of the inlet 124, which keeps the bundle in the predetermined regular intervals, and issue from it through dies of the outlet, the dies sealing the molten metal M. Roller dies are preferably used as the dies of the outlet for reducing load which is applied to the superconductors 130 when, they come out of the bath 123. The bath 123 has a ultrasonic wave generator 126 at the inner bottom thereof for vibrating the molten metal M and heaters 127 below the bottom for heating the molten metal M. When the bundle 110 of the superconductors 52 issues from the bath 123, the molten metal M, adhered to it, is solidified to form a bundle coating 125 coating it, so that a multifilamentary superconducting wire 130, as illustrated in FIG. 15, is fabricated. When the superconductors 52 have a large mechanical strength, the bundle 110 thereof may be twisted for enhancing magnetic stability of the multifilamentary superconductor 130. In such a case, the first and second separators 121 and 122 may be synchronously rotated at low speeds for twisting the bundle 110 between the second separator 122 and the outlet of the bath. The molten metal may be metals previously mentioned in connection with the coating metals 50. The multifilamentary superconductor 130 is water cooled with a water cooling device 128. When the bundle coating 125 is made of aluminum, it serves as a stabilizer when superconductive state of the superconductor is broken.

Figure 16:
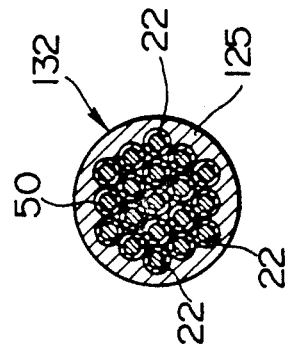
FIG. 16 is an enlarged cross-sectional view of a modified multifilamentary superconductor in FIG. 15.

When the coating 50 and the bundle coating 125 are made of different metals, a multifilamentary superconductor 132 as illustrated in FIG. 16 is fabricated. In this case, the coating 50 may be formed of a metal having a melting point higher than that of the bundle coating 125.

Instead of the coated superconductors 52, uncoated superconductors 22 may be used for producing a multifilamentary superconductor in a similar manner.

Other preferred modes of the Invention

It has been discovered that when superconducting materials are calcined or sintered at high temperatures for a long period of time for, enlarging crystal grains, clearances between crystal grain may excessively increase, so that oxide superconductors produced may be rather degraded in critical current density. For reducing this drawback, calcining, intermediate sintering and sintering operations may be carried out in the following conditions although other production conditions of which description is omitted are the same as as hereinbefore described. The filling material may be calcined about 800° to about 950° C. for about 6 to 50 hours. Under these conditions, the particle size of the calcined material may be 10 $\mu$m or smaller. The calcining temperature is preferably about 850° to about about 920° C. Within this temperature range, the calcined material may have a particle size of 5 $\mu$m or smaller, which material facilitates the producing of a superconducting material having a particle size of 10 $\mu$m or smaller after intermediate sintering. In the intermediate sintering, a compact, which may be prepared in the same conditions as previously described in the subtitle "The filling material", is subjected to the intermediate sintering at about 800° to about 950° C., preferably 850° to about 920° C., for about 6 to about 50 hours in oxygen atmosphere and then may be gradually cooled to thereby produce an intermediate sinter rod. The preferable temperature range facilitates to produce an intermediate sintering with fine crystal grains equal to 10 $\mu$m or smaller. After the sheathing, cross-sectional area reduction and removing of the sheath, the exposed core undergoes the heat treatment at about 800° to about 950° C., preferably 800° to about 920° C., for about 6 to about 50 hours in oxygen atmosphere for producing an oxide superconductor with fine crystal structure.

A solidified material which is made of a molten starting material may contain excellent oxide superconductors and from the solidified material an excellent superconductor with relatively high critical current density may be produced. According to this modified, method, the superconductor is produced in the same conditions as previously stated except the following. The starting material powder, already stated in connection with "The filling material", is calcined at about 750° to about 950° C. for about 3 to about 50 hours and then pulverized to a predetermined particle size. Subsequently, the calcined powder is subjected to intermediate sintering at about 800° to about 950° C. for about 3 to about 50 hours and then cooled to produce a superconductive oxide powder. For producing Bi-Sr-Ca-Cu oxide superconductor, the calcined powder undergoes intermediate sintering preferably at 890° C. for 20 min. and then at 880° C. for 9 hours, after which it is rapidly cooled. For Y-Ba-Cu oxide superconductor, the slow cooling previously described, which includes transformation to a rhombic system, is preferably made. The sintered powder is placed in a platinum or CaO crucible where it is heated at about 1300° C. in an oxygen containing atmosphere to produce a molten material, which is solidified by rapid cooling to a temperature of about 800° to about 950° C. This rapid cooling may be carried out by taking out the crucible, containing the molten material, from the heating appliance and placing it in the atmosphere. Alternatively, the crucible may be forcedly cooled by using a coolant. After maintained at the temperature about 800° to about 950° C. about several to about several tens hours, the solidified material is cooled to room temperature. The cooling to the room temperature may be rapidly made for Bi-Sr-Ca-Cu-O system superconductor. The slow cooling as previously described, which includes transformation to a rhombic system, is preferable for Y-Ba-Cu oxide superconductor. A surface portion of the solidified material thus obtained is cut with a thickness 1 mm or smaller, preferably about several $\mu$m to about several hundreds $\mu$m by machining and is then pulverized to produce a surface powder which contains high purity and homogeneous superconductive oxide. The remaining solidified material is remelted and reused for obtaining the surface power in the same manner. Such a powder may be directly obtained by injecting the molten material into the atmosphere at about 800° to about 950° C. with a carrier gas. However, the powder should have a particle size of about several hundreds $\mu$m or smaller. These powders, obtained from the solidified material, may be pressed to form the bar-shaped compact, already stated, which may be heat treated at about 800° to about 950° C. for about 6 to about 50 in an oxygen atmosphere to increase the content of the oxide superconductor. After subjected to sheathing, cross-sectional area reduction and removal of the sheath, the exposed core is sintered at about 800° to about 950° C. for about 6 to about 50 in an oxygen atmosphere.

EXAMPLE 1

Powders of $Y_2O_3$, $BaCO_3$ and CuO were mixed at mole ratio Y: Ba: Cu=1:2:3 to obtain a starting material powder mixture, which was calcined, at 900° C. for 24 hours in the atmosphere and then pulverized to produce a calcined powder. This calcined powder was pressed by a rubber press to form a compact, which was heated at 900° C. for 24 hours and then gradually cooled to produce a rod containing a superconductive oxide $Y_1Ba_2Cu_3O_{7-\delta}$ of which critical current density was about 40 A/cm$^2$. The rod had a sintered density of about 75%. The rod was inserted into a silver pipe having an outer diameter 10 mm and inner diameter 7 mm to form a preform, which was cold forged in a stepwise manner by a rotary swaging machine as illustrated in FIGS. 4 and 5 to produce a composite wire with a diameter 1.5 mm without breaking. This cold forging was carried out at a processing speed of 1 m/min with a forging ratio of about 20% for each diameter reduction. The sintered density of the core of the composite wire was more than about 75%. The silver sheath of the composite wire was removed by placing it in nitric acid to expose the core. The exposed core was heated at 850° to 950° C. for 24 hours and then gradually cooled to room temperature at a speed of −100°

C./hour to produce a superconductor. The superconductor exhibited a critical temperature (Tc) of 91K and a critical current density (Jc) of about 10000 A/cm$^2$ at 77K. This superconductor could be wound around a magnet core without crack and showed a sufficient mechanical strength.

EXAMPLE 1A

A superconductor was prepared in the same manner and conditions as in Example 1 with the starting material powders of a particle size about 2 $\mu$m. In this Example, the pulverized, calcined powder had a particle size about 10 $\mu$ and was pressed at 3 metric tons/cm$^2$ to form the compact, having a green density about 65% of the theoretical density, which compact was heated in ambient flowing oxygen of 2 liters/min and subsequently gradually cooled at $-200°$ C./hour to produce the superconducting rod, which had a sintered density about 75%. The expose core was subjected to the final heating in ambient flowing oxygen of about 2 liters/min and then gradually cooled to produce an oxide superconductor, of which sintered density was about 95% of the theoretical density. The superconductor thus produced exhibited a critical temperature of 91K and a critical current density of about 10000 A/cm$^2$ at 77K.

COMPARATIVE TESTS 1 AND 2

Two oxide superconductors were prepared in the same conditions and manner as the Example 1 except that sintered density of compacts for Comparative Tests 1 and 2 were 65% and 70% respectively. The superconductors of Comparative Test 1 and 2 exhibited critical current density of 200 A/cm$^2$ and 500 A/cm$^2$, respectively.

EXAMPLE 2

Powders of $Y_2O_3$, $BaCO_3$ and CuO were mixed at ratio Y: Ba: Cu=1:2:3 to obtain a powder mixture, which was calcined at 900° C. for 24 hours in the atmosphere. This calcined powder was pressed to form a compact, which is heated at 900° C. for 24 hours and then pulverized. These pulverizing, pressing and heating operations were repeated three times to produce a superconductive powder containing a superconductive oxide $Y_1Ba_2Cu_3O_{7-\delta}$, from which a superconducting powder of 0.5 to 1 $\mu$m particle size was obtained by coprecipitation method and was pressed by hydrostatic pressing at pressure of 2.5 ton/cm$^2$ to produce a rod-shaped compact of 6.5 mm diameter, which was heated at 900° C. for 24 hours in an oxygen atmosphere to obtain a first sinter, of which sintering density was 75% of the theoretical density. The first sinter was inserted into a silver pipe having the same silver pipe in Example 1 to form a preform, which was cold forged in the same manner as in Example to obtain a 1.5 mm diameter composite wire without breaking thereof. The sintered density of the core of the composite wire was about 80% of the theoretical density. The composite wire was subjected to the removing of the silver sheath, the heat treatment and the slow cooling in the same conditions as the Example 1 except that the final heat treatment was carried out for 12 hours instead of 24 hours. The heat treated, exposed core was coated with a 1 mm thick solder coating by plating to produce a superconductor. The superconductor was equal in superconductivity in critical temperature and critical current density to the superconductor of Example 1 and also showed an excellent mechanical strength in winding around a magnetic core.

COMPARATIVE TESTS 3 AND 4

Two oxide superconductors were prepared in the same conditions and manner as the Example 1 except that sintered density of the core in the sheath was smaller than 75% and sintered density of compacts for Comparative Tests 3 and 4 were 80% and 85% respectively. The superconductors of Comparative Tests 3 and 4 exhibited critical current density of 200 A/cm$^2$ and 500 A/cm$^2$, respectively.

EXAMPLE 3

Powders of $Y_2O_3$ with particle size 4 $\mu$m or smaller, $BaCO_3$ with particle size 1 $\mu$m or smaller, and CuO with particle size 1 $\mu$m or smaller, of which each powder had purity of 99.9% or more, were mixed with a ball mill at mole ratio Y: Ba: Cu=1:2:3 to obtain a powder mixture, which was calcined at 900° C. for 24 hours in ambient flowing oxygen. This calcined powder was pulverized and then pressed to form a round bar shaped compact at 2500Kg/cm$^2$. This series of heating, pulverizing and pressing operations were repeated three times to produce a 6.5 mm diameter bar-shaped calcined compact, of which sintered density was about 90% of the theoretical density. The rod was inserted into the same silver pipe as in Example 1 and was obtained a 1.5 mm diameter in the same manner as in Example 1 except for forging ratio of 10% per each pass. The sintered density of the core of the composite wire was about 80% of the theoretical density. The composite wire was subjected to the removal of the sheath, the final heating and slow cooling in the same conditions and manner as in Example 1 except that the final heat treatment was carried out at 890° C. for 17 hours. The superconductor thus produced, of which sintered density was 93% of the theoretical density, exhibited a critical temperature of 91K and about 11,000 A/cm$^2$ at 77K and also showed an excellent mechanical strength in winding a magnetic core.

EXAMPLE 4

A calcined compact of which green density was about 62% was prepared in the same conditions and manner as in Example 3, and then heated at 900° C. for 24 hours in ambient flowing oxygen with subsequent slow cooing to produce a round-rod-shaped intermediate sinter, containing a superconductive oxide $Y_1Ba_2Cu_3O_{7-\delta}$ ($0 \leq \delta \leq 5$), of which sintered density was about 72%. The intermediate sinter was inserted into a silver pipe having the same silver pipe in example 1 to form a preform, which was cold forged in the same manner as in Example to obtain a 1.5 mm diameter composite wire without breaking thereof. The composite wire was subjected to the removing of the silver sheath, the heat treatment and the slow cooling in the same conditions as the Example 1 except that the final heat treatment was carried out at 890° C. for 17 hours. With the final heat treatment, a sinter with a sintered density of about 92% was obtained. The superconductor thus produced exhibited a critical temperature of 91K and about 11,000 A/cm$^2$ at 77K and also showed an excellent mechanical strength in winding a magnetic core.

COMPARATIVE TESTS 5 and 6

Two oxide superconductors were prepared in the same conditions and manner as the Example 4 except that green density of the calcined compact for Comparative Test 5 and 6 were 50% and 55%, respectively. The superconductors of Comparative Tests 5 and 6 had sintered density of 80% and 85% and exhibited critical current density of 200 A/cm$^2$ and 500 A/cm$^2$, respectively.

EXAMPLE 5

The compact was prepared in the same conditions and manner as in Example 2 except that the powder mixture was calcined in a heating furnace with flowing 100% purity oxygen of 80 cm/min. The pulverizing, pressing and heating operations were repeated also three times to obtain the compact, which was inserted in the same silver pipe as in Example 2 and then diameter reduced by using a rotary swaging machine to produce a composite wire with 1.5 mm outer diameter. The sheath of the composite wire was removed with an acid to expose the core, which was heated at 890° C. for 17 hours and then gradually cooled to produce a superconductor wire, of which critical current density Jc at 77K and oxygen defect rate δ are given in Table 1.

COMPARATIVE TESTS 7-10

Oxide superconductors were prepared in the same conditions and manner as in Example 5 except that calcining was carried out for oxygen concentration of 21%, which corresponds to the atmosphere, to 80%. The critical current density Jc at 77K and oxygen omission rate d of each superconductors are given in Table 1, from which it would be clear that a superconductor calcined with an oxygen concentration of 90% or more provides excellent superconductivity.

TABLE 1

|  | Ex. 5 | Comparative Tests | | | |
| --- | --- | --- | --- | --- | --- |
|  |  | 7 | 8 | 9 | 10 |
| Oxygen Concentration (%) | 100 | 80 | 60 | 40 | 21 |
| Jc (A/cm$^2$) | >10$^4$ | 2000 | 1200 | 920 | 640 |
| d | 0.05 | 0.19 | 0.31 | 0.35 | 0.40 |

EXAMPLE 6

Powders of Y$_2$O$_3$, BaCO$_3$ and CuO were mixed at ratio Y: Ba: Cu=1:2:3 to obtain a powder mixture, which was calcined at 900° C. for 24 hours in ambient flowing oxygen and then pulverized to produce a calcined powder. This calcined powder was pulverized and then placed within a rubber tube, having 7 mm inner diameter, which was in turn pressed by a rubber press at 2.5 ton/cm$^2$ to form a compact. The compact was heated at 900° C. for 24 hours. These pulverizing, pressing and heating operations were repeated three times to produce a sinter with an outer diameter 6.9 mm, of which density was 4.5 g/cm$^3$. The sinter was placed within the same silver pipe as in example 1 and then subjected to cold forging, removal of the sheath and the final heat treatment also in the same conditions and manner as in Example 1 except tha the core was heated at 900° C. for 12 hours in an oxygen atmosphere. The core thus obtained was coated by plating with a 1 mm thick solder protection layer was carried out at a processing speed of 1 m/min with a forging ratio of about 20% for each diameter reduction. The sintered density of the core of the composite was more than about 75%. The silver sheath of the composite wire was removed by placing it in nitric acid to expose the core. The exposed core was heated at 850° to 950° C. for 24 hours and then gradually cooled to room temperature at a speed of − 100° C./hour to produce a superconductor. By repeating these operations, samples of the superconductor was prepared. Densities of the cores after the sheath removal and heat treated are given in Table 2 as well as its critical current density Jc at 77K.

COMPARATIVE TEST 11

Oxide superconductors were prepared in the same conditions and manner as in Example 6 except that the calcined powder was directly inserted into the silver pipe without being pulverized and pressed. The density of the core before swaging was 3.5 g/cm$^3$. Densities of the core after the sheath removal and heat treated are given also in Table 2 as well as its critical current density Jc at 77K.

TABLE 2

|  | Ex. 6 | Comparative Test 11 |
| --- | --- | --- |
| Density after removal of the sheath (g/cm$^3$) | 4.9–5.1 | 4.0–4.3 |
| Density after the heat treatment (g/cm$^3$) | 5.8–5.9 | 5.2–5.4 |
| Jc (A/cm$^2$) | 7000–10000 | 40–980 |

EXAMPLE 7

Superconductors were prepared in the same conditions and manner as in Example 6 except that the diameter reduction was conducted by drawing with a die for each sample. The experimental results are given in Table 3.

COMPARATIVE TEST 12

Superconductors were prepared in the same conditions and manner as in Comparative Test 11 except that the diameter reduction was conducted by drawing with a die for each sample. The experimental results are given in Table 3.

TABLE 3

|  | Ex. 7 | Comparative Test 12 |
| --- | --- | --- |
| Density after removal of the sheath (g/cm$^3$) | 4.7–4.9 | 3.9–4.1 |
| Density after the heat treatment (g/cm$^3$) | 5.6–5.7 | 5.0–5.1 |
| Jc (A/cm$^2$) | 1100–2000 | 25–640 |

EXAMPLE 8

Powders of Y$_2$O$_3$, BaCO$_3$ and CuO were weighed 9.0791 g, 31.7451 g and 19.1858 g, respectively, so that Y:Ba:Cu=1: 2:3 and placed in beaker, into which was poured 80 ml of 60% nitric acid aqueous solution for completely dissolving the powders to obtain a starting powder solution, to which were added 120 g of citric acid and fully stirred for complete dissolution. Then, 28% aqueous ammonia was added for neutralization to thereby obtain a pale transparent (neutralized) solution of pH 7, which which was subsequently heated at 200° C. with the result after water was evaporated, a porous mass was pyrolized and burnt, so that sponge material was obtained, which was confirmed by X-ray diffraction to be a mixture of $Y_2O_3$, $BaCO_3$ and CuO. The mixture was pulverized in an automatic mortar for 30 minutes to produce a powder of a particle size about 0.1 to about 0.6 μm, which was calcined for 900° C. for 24 hours in ambient flowing oxygen. The calcined powder was then further pulverized by a ball mill to produce a pulverized powder, which was pressed at 2.5 metric tons/cm$^2$ to form a compact bar, which was in turn heated at 890° C. for 12 hours in an oxygen gas atmosphere. This series of pulverizing, pressing and heating operations was repeated three times to obtain compact with 6.9 mm diameter, which subsequently underwent sheathing, rotary swaging, sheath removing, and final heating in the same conditions and manner as in example 1 except that the final heating was carried out at 890° C. for 12 hours, followed by slow cooling. The composite wire after swaging and the core of the superconductor had sintered density of 82% and 91% or more, respectively. The superconductor exhibited a critical temperature of 91K and critical current density of about 11000 A/cm$^2$ at 77K.

EXAMPLE 9

With control of pH 7 to 8 by adding 28% aqueous ammonia, a precipitation was produced in the citric acid added solution which was prepared in the same conditions and manner as in Example 8 except that 70.9548 g of citric acid was added to the starting material dissolved solution. The precipitation was dried at 150° C. and it was confirmed by X-ray diffraction that it was a mixture of Y, Ba, Cu and O. The mixture was subjected to calcining, pressing, intermediate sintering, sheathing, rotary swaging, sheath removing, final heating and slow cooling in the same manner and conditions as in Example 8. The superconductor, thus produced, was equal in critical temperature and critical current density to the superconductor of Example 8.

EXAMPLE 10

A pulverized, calcined powder was prepared by the same conditions and manner except the powder mixture was calcined at 850° C. for 24 hours. It was observed by microscopy that the pulverized, calcined powder had an average particle size of 5 μm or smaller. The powder was pressed by a rubber press at 2.5 t/cm$^2$ to form a rod compact, which was heated at 850° C. for 24 hours in an oxygen atmosphere and then gradually cooled at −200° C./hour to produce a round rod intermediate sinter, containing a superconductive oxide $Y_1Ba_2Cu_3O_{7-\delta}$, of which average particle size was confirmed to be 10 μm or smaller. The intermediate sinter was sheathed, underwent rotary swaging, and then removal of the silver sheath in a manner similar to the manner in Example 1 to produce an exposed core. The exposed core was subsequently heated at 850° C. for 50 hours in an oxygen atmosphere and then gradually cooled to room temperature at a speed of −200° C./hour to produce a superconductor. The superconductor exhibited a critical temperature of 91K and about 10,000 A/cm$^2$ at 77K and had a density of 5.8 g/cm$^3$ at its superconducting portion.

COMPARATIVE TEST 13

An oxide superconductor was produced in the same conditions and manner except that in each of the calcining, intermediate sintering and the final sintering, the heating temperature was 980° C. This superconductor has a density of 5.8 g/cm$^3$ at is superconducting portion.

EXAMPLE 11

A calcined powder was prepared in the same conditions and manner as in Example 1 and then heated at 890° C. for 14 hours in an oxygen atmosphere to produce $Y_1Ba_2Cu_3O_{7-\delta}$ superconductor, which was then placed in a platinum crucible, where it was heated at 1300° C. in an oxygen atmosphere to melt. The molten material was rapidly cooled to 900° C. in an oxygen atmosphere and was maintained at this temperature for 10 hours, after which it was gradually cooled to room temperature at −200° C./hour to form a solidified material. A surface layer of the solidified material was taken away and was pulverized to produce a powder, which was pressed with a rubber press to form a rod compact having 8 mm diameter. This rod was sheathed with a silver pipe having 15 mm outer diameter and 10 mm inner diameter to form a preform, which was diameter reduced by rotary swaging machine and drawing die for 1.0 mm diameter composite wire. The silver sheath was removed by dissolving with a dilute nitric acid for exposing the core, which was then heated at 890° C. for 3 hours in an oxygen atmosphere to produce an oxide superconductor. This superconductor exhibited critical current density (Jc) of $1.6 \times 10^4$ A/cm$^2$ in zero magnetic field and $1.2 \times 10^4$ A/cm$^2$ in 2 T magnetic field.

EXAMPLE 12

Powders of $Y_2O_3$ with particle size 4 μm, $BaCO_3$ with particle size 1 μm, and CuO with particle size 1 μm were mixed with a ball mill at mole ratio Y:Ba:Cu=1:2:3 to obtain a powder mixture, which was calcined, pulverized and then pressed to form a bar shaped compact in the same conditions and manner as in Example 3. This series of heating, pulverizing and pressing operations were repeated to produce a 6.9 mm diameter compact, of which sintered density was about 78% of the theoretical density with critical current density of about 40 A/cm$^2$. This compact was sheathed and underwent rotary swaging, removal of the sheath, the final heating and slow cooling in the same conditions and manner as in example 3 except for forging ratio of 20% per each pass. The green density of the core of the composite wire after the rotary swaging was 82% and the sintered density of the superconductive core was about 91.5% of the theoretical density. The core was coated with 1 mm thick protective coating by solder coating. The superconductor thus produced exhibited a critical temperature of 91K and a critical current density of about 11,000 A/cm$^2$ at 77K and also showed a sufficient mechanical strength in winding a magnetic core.

EXAMPLE 13

The starting material powder of Example 1 was calcined at the same temperature for 12 hours and then pulverized to form a calcined powder, which was heated at 890° C. for 12 hours at ambient flowing oxygen of 2 liters/min. The heated powder was charged into a silver pipe having an inner diameter 7 mm and outer 7 mm with a 2 mm diameter silver core wire inserted into it to thereby obtain a preform, which was rotary swaged in a stepwise manner to have a diameter 1.4 mm with a forging ratio of about 10% for each pass at a processing speed of 1 m/min. The composite wire thus obtained underwent sheath removal, final heating, and sow cooling in the same conditions and manner as in example 1 except that the slow cooling was carried out at −200° C./hour to produce an oxide superconductor, which was then coated with a protection coating layer by solder plating to obtain a superconducting wire with an outer diameter 1 mm. The superconducting wire exhibited a critical temperature of 92K and a critical current density of about 12,000 A/cm$^2$ at 77K. This superconductor could be wound around a magnet core without any substantial crack and showed a sufficient mechanical strength.

EXAMPLE 14

The starting material powder mixture of the Example 1 was calcined, pulverized and then pressed at 2.5 metric tons/cm$^2$ to form a rod compact in the same conditions and manner as in Example 1 except that the pulverized, calcined powder was charged into a rubber tube with inner diameter 7 mm and outer diameter 10 mm, which was then placed within a vacuum chamber held at a vacuum level about 10$^{-4}$ mmHg. In this condition, the rubber tube was sealed and then pressed to form the rod compact, which was subsequently subjected to intermediate sintering, sheathing, rotary swaging, sheath removing, final heating and then slow cooling in the same conditions and manner as in Example 1 except that the rod compact underwent intermediate sintering for 12 hours in an oxygen atmosphere. The superconductor, thus obtained, exhibited a critical temperature (Tc) of 91K and a critical current density (Jc) of about 11,000 A/cm$^2$ at 77K.

EXAMPLE 15

The starting material powder mixture was calcined at 700° C. for 24 hours and then calcined 900° C. for 24 hours to produce a calcined powder, which was then charged into a silver pipe having an inner diameter 7 mm and outer diameter 10 mm to form a preform, which was subjected to rotary swaging, sheath removing and final heating ian the same conditions and manner except that the preform was diameter reduced to a diameter of 1.4 mm. In the rotary swaging, the preform was cold forged by changing traveling direction for each passing. The composite wire, thus formed, had a core with a diameter 0.8 mm. The superconductive core wire produced was coated with a 1 mm thick protection coating by solder plating. The superconductor was equal in critical temperature and critical current density to the superconductor of Example 1 and also showed sufficient mechanical strength.

EXAMPLE 16

A superconductive core wire was prepared in the same conditions and manner as in example 1 except that after the rubber pressing, the rod compact was heated at 900° C. for 24 hours in an oxygen atmosphere to produce a compact having a diameter 6.9 mm, of which sintered density was 78% of the theoretical density. The compact was then subjected to sheathing, rotary swaging, sheath removing and final heating in the same conditions and manner as in example 1 except that the final heating was made at 900° C. for 24 hours. The composite wire had a core of 82% green density of the theoretical density ad the superconducting core had a sintered density of 91.5% of the theoretical density after the final heating. The superconductive core was coated with a 1 mm protective coating by solder plating to produce a superconductor, which was equal in critical temperature and critical current density to the superconductor of Example 1 and also showed a sufficient mechanical strength in winding a magnet core.

EXAMPLE 17

An oxide superconductor was produced in the same conditions and manner as in Example 2 except that the rod-shaped compact, formed by the hydrostatic pressing, had a diameter 7 mm and length of 100 mm, that the preform was diameter reduces so that the composite had a diameter 3 mm and length of about 234 m. The superconductor had a critical temperature of 91K and critical current density of about 110000 A/cm$^2$. An excellent cutting was made to the superconductor by a diamond cutter with little cracks due to the cutting.

EXAMPLE 18

A superconducting powder including Y$_1$Ba$_2$Cu$_3$O$_{7-\delta}$ (0 ≦ δ ≦ 5) was charged into an aluminum pipe having 10 mm outer diameter and 6 mm inner diameter to form a preform, which was diameter reduced by rotary swaging in a stepwise manner to form a composite with 1.5 mm outer diameter, which was in turn immersed in 50% sodium hydroxide for dissolving the aluminum sheath to expose the core. The exposed core was heated at 900° C. for 5 hours in an oxygen atmosphere for producing an oxide superconductor, of which critical current density at 77K is given in Table 4.

COMPARATIVE TESTS 14 AND 15

An aluminum sheathed composite wire was prepared in the same conditions and manner as in Example 18 and removed by dissolving with 50% sulfuric acid to obtain an exposed core for Comparative Test 14. Another composite wire was prepared for Comparative Test 15 in the same conditions and manner as in Example 18 except that a silver sheath of the same configuration was used. The silver sheath was removed with 50% nitric acid aqueous solution to exposed its core. The two exposed cores were heat treated in the same conditions as in Example 18 to produce superconductors, each of which had critical current density at 77K as given in Table 4.

TABLE 4

|  | Ex. 18 | Comparative Tests | |
| --- | --- | --- | --- |
|  |  | 14 | 15 |
| Critical current density (× 10$^3$ A/cm$^2$) | 23 | 4.9 | 5.2 |

EXAMPLE 19

Powders of Y$_2$O$_3$ (purity: 99.99%), BaCO$_3$ (purity: 99.9%) and CuO (Purity: 99.9) were weighed so that Y:Ba:Cu=1: 2:3 in mole ratio, and then mixed to obtain a powder mixture, which were calcined at 900° C. for 24 hours in the atmosphere and then pulverized to produce a superconducting powder which includes an oxide superconductor Y$_1$Ba$_2$Cu$_3$O$_{7-\delta}$. The superconducting powder was pressed by a rubber press into a rod compact, which was heated at 890° C. for 12 hours in ambient flowing oxygen gas of 2 liters/min to produce a sintered compact, which was in turn inserted into a copper pipe, having an inner diameter 8 mm and outer diameter 15 mm to form a preform. Subsequently, the preform was drawn into a composite wire having an outer diameter 1.5 mm and length 500 mm, of which core had a diameter 0.8 mm. The composite wire was wound around a reel and introduced at a speed of 20 mm/min into a heating tube as shown in FIG. 8, where it was induction heated to melt the sheath for exposing the core. The heating tube had five high frequency induction coils of which first one had a length L1 of 0.5 m and the others had a length L2 of 3 m. Each coil was supplied with 30 kHz to 100 kHz of alternating current. Thus, the coils were adjusted so that the first coil with 0.5 m length was provided with an output of 50 kW for enabling to melt the copper layer, which coated the core of the composite, and the other coils were provided with outputs of 20-100 kW for heating the exposed core of the composite at a temperature 890° C.±5° C. In the slow cooling portion 42B of the heating tube had a length L3 5 m for gradually cooling the heated core. In the induction heating, the inside of the heating tube was placed in an oxygen atmosphere by introducing hot oxygen gas at a flow rate of 2 liters/min via oxygen supply tubes 36. A receptacle 44 of FIG. 9 was located below the heating tube 40 for recovering copper molten from the composite 6. After the heat treatment, the heated core was introduced through the bottom of the treating bath E and then issued from the top thereof. During moving in the bath E, the core passed through molten Sn-Pb solder during which ultrasonic waves were applied to it with frequency 60 kHz and output 10 W. After issuing from the bath, the core was cooled so that a superconductor wire coated with about 50 $\mu$m solder coating was produced. No breaking of the superconductor wire was noted. The core of the superconductor had a critical temperature of 91.0° C. and critical current density of about 15000 A/cm$^2$ in liquid nitrogen.

EXAMPLE 20

An oxide superconductor was produced in the same manner and conditions as in Example 12: the starting material powder mixture was calcined in ambient flowing oxygen of 1 liter/min; and the final heating was made also in ambient flowing oxygen of the same flow rate. This superconductor was equal in critical temperature and critical current density to the superconductor of Example 12.

EXAMPLE 21

The starting material powder mixture was calcined, pulverized, pressed and heated in the same manner and conditions as in Example 1 except that the compact was heated at 890° C. for 14 hours in an oxygen atmosphere. The intermediate sinter, thus obtained, wa sheathed with a silver pipe having a 10 mm outer diameter and a thickness 1.5 mm and then subjected to rotary swaging to form a composite wire with a 1.0 mm diameter, which was placed in a 50% nitric acid aqueous solution for removing the silver sheath to expose the core. The exposed core was heated at 890° C. for 12 hours in an oxygen atmosphere and then gradually cooled to produce an superconducting core, which was then coated with about 10 to about 20 $\mu$m aluminum coating by placing it within an aluminum bath which was being vibrated with 20 W 60 kHz ultrasonic wave generator. Fifty superconducting core wires of this example were prepared and pulled to pass through the first and second separators, as in FIG. 14, which were rotated at a low speed for twisting, into an aluminum bath with an ultrasonic wave generator and then to issue from it for solidifying the molten aluminum adhered to the core wire to form a multifilamentary superconductor with an aluminum stabilizer, which exhibited a critical temperature (Tc) of 91K and a critical current density (Jc) of about 11,000 A/cm$^2$ at 77K.

EXAMPLE 22

BaCO$_3$ and CuO powders, having a particle size about 3 $\mu$m, were mixed so that Ba:Cu=2:3 at mole ratio, the mixture was then calcined at 880° C. for 10 hours in atmospheric air to produce a calcined powder, having a composition of Ba$_2$Cu$_3$O$_5$. The calcined powder was pulverized to a particle size about 10 $\mu$m and then mixed with both Tl$_2$O$_3$ and CaO powders, having a particle size about 3 $\mu$m to form a mixture so that Tl:Ca:Ba:Cu=2:2:2:3 at mole ratio. The starting material thus prepared was pressed to form a compact, with a green density 75% of the theoretical density, which was then heated at 870° C. for 1 hour in ambient flowing oxygen 2 liters/min, followed by slow cooling at −200° C./hour to thereby produce an intermediate sinter having a composition Tl$_2$Ca$_2$Ba$_2$Cu$_3$O$_j$ (j undetermined) and a sintered density of about 85% of the theoretical density. The intermediate sinter was inserted into a silver pipe having an outer diameter 10 mm and a thickness 1.5 mm to form a preform, which was diameter reduced by a rotary swaging machine to a 0.5 mm diameter composite wire, which was then immersed in a dilute nitric acid to remove the silver sheath for exposing the core, which was in turn heated at 870° C. for 30 minutes in ambient flowing oxygen gas of 2 liters/min to thereby produce a superconductor, having a composition Tl$_2$Ca$_2$Ba$_2$Cu$_3$O$_j$ (j undetermined) and a sintered density about 92% of the theoretical density, which had a critical temperature of 120K and critical current density of $2 \times 10^4$ A/cm$^2$ at 77K.

EXAMPLE 23

Solutions of nitrates of Bi, Pb, Sr, Ca and Cu were mixed so that Bi:Pb:Sr:Ca:Cu=1.4:0.6:2:2:3 at mole ratio, and then ammonium oxalate was added to coprecipitate oxalates of the superconductor materials, which were dried to obtain a powder mixture with a particle size about 0.1 $\mu$m, which was in turn calcined at 820° C. for 12 hours in atmospheric air to produce a calcined powder. The calcined powder was charged into a silver pipe, having an outer diameter 10 mm and a thickness 1.5 mm, to form a preform, which was then diameter reduced by a rotary swaging machine to form a 1.5 mm diameter composite wire, having a 0.8 mm diameter core of a green density 85% of the theoretical density, which was then passed through high frequency induction coils to remove the silver sheath for exposing the core. Subsequently, the exposed core was heat treated at 850° C. for 50 hours in atmospheric air to thereby produce a superconductor having a composition Bi$_2$Pb$_u$Sr$_2$Ca$_2$Cu$_3$O$_v$(u and v undetermined) and a sintered density of about 95% of the theoretical density, which was then coated with a 1 mm thick ceramics solder protection coating in a solder bath, containing a molten ceramics solder which includes lead, zinc, tin, aluminum, antimony, titanium, silicon, copper and cadmium, during application of 60 kHz ultrasonic waves at 10 W output to the surface of superconductor. The coated superconductor had a critical temperature of 105K and critical current density of $1 \times 10^4$ A/cm$^2$ at 77K.

What is claimed is:

1. A method of producing a superconductor including a superconductive oxide represented by the formula $A_xB_yCu_2O_{7-\delta}$ provided that the A is at least one element selected from the group consisting of Sc, Y, La, Ce, Pr, Nd, Pm, Sm, Eu, Gd, Tb, Dy, Ho, Er, Tm, Yb and Lu, and the B is Sr or Ba, about $0.1 \leq x \leq$ about 2.0, about $1 \leq y \leq$ about 3, about $1 \leq z \leq$ about 3, $0 \leq \delta \leq 5$, comprising the steps of:

(a) pressing at least one material, selected from the group consisting of a starting material powder of the superconductive oxide, a powder of the superconductive oxide and a compact made of the starting material powder and/or the superconductive oxide powder, for forming a filling material;

(b) charging the filling material into a metallic pipe to form a preform;

(c) moving the preform along an axis thereof;

(d) during the moving step (c), swaging the preform perpendicularly to the axis thereof at a forging ratio of about 10 to about 40%, rotating a direction of the swaging about the axis, so as to form a composite having a metallic sheath, made of the metallic pipe, and a core sheathed with the metallic sheath;

(e) removing the metallic sheath from the composite for exposing the core; and (f) heating the exposed core of the composite for producing the superconductive oxide.

2. A method as recited in claim 1, wherein the swaging step (d) is performed more than twice.

3. A method as recited in claim 2, wherein the preform has opposite ends, and wherein each of the swaging step (d) comprises the steps of (g) first swaging the preform from one end to the other and (h) second swaging the swaged preform in the step (g) from the other end to the one end.

4. A method as recited in claim 3, wherein in the swaging step (d), the preform is swaged so that the core of the preform has a green density of 75% or more of the theoretical density thereof.

5. A method as recited in claim 4, wherein the metallic sheath removing step (e) comprises the step of placing the composite in a treating liquid for dissolving the metallic sheath into the liquid.

6. A method as recited in claim 5, wherein the sheath removing step (g) comprises the step of removing the treating liquid adhered to the core, of which metallic sheath has been removed, for reducing an adverse influence of the treating liquid in superconductivity on the core in the heating step (e).

7. A method as recited in claim 6, wherein the metallic pipe is made of an alkali soluble metal, and wherein the treating liquid dissolves the alkali soluble metal.

8. A method as recited in claim 4, wherein the metallic sheath removing step (g) comprises machining the composite for removing the metallic sheath.

9. A method as recited in claim 4, wherein the metallic sheath removing step (g) comprises applying high frequency waves to the composite, swaged in the swaging step (d), for melting the metallic sheath to thereby remove the metallic sheath.

10. A method as recited in claim 9, wherein the heating step (e) comprises applying high frequency waves to the composite, swaged in the swaging step (d), for melting the metallic sheath to thereby remove the sheath.

11. A method as recited in claim 9 wherein the moving step (c) comprises vertically elevating the composite along the axis thereof, and wherein high frequency waves are applied to the composite for melting the metallic sheath during the vertically elevating step.

12. A method as recited in claim 4, wherein in the heating step (e), the exposed core is heated at about 850° to about 920° C. for about 1 to about 100 hours.

13. A method as recited in claim 12 wherein in the heating step (e), the exposed core is heated in an oxygen atmosphere containing about 90 vol. % or more of oxygen gas.

14. A method as recited in claim 13, further comprising the steps of: preparing a plurality of the cores heat treated in the step (e); bundling the cores prepared to form a core bundle; passing the core bundle through a molten metal, having a melting temperature lower than the temperature of the heat treatment in the step (e), for adhering the molten metal to the cores; and cooling the molten metal adhered the core bundle for solidifying to thereby bury the core bundle within the molten metal adhered for producing a multifilamentary oxide superconductor.

15. A method as recited in claim 14, wherein the low melting point metal is selected from the group consisting of an alloy of zinc and copper, alloy of tin and lead, aluminum, tin, zinc, lead, indium, gallium and bismuth.

16. A method as recited in claim 4, wherein the pressing step (a) comprises the steps of: (h) forming a compact having a green density of about 60% or more of the theoretical density; and (i) intermediate sintering the compact for producing an intermediate sinter, as the filling material, having a sintered density of about 70% or more, and wherein the heated core in the step (e) has a sintered density of about 92% or more.

17. A method as recited in claim 14 wherein the intermediate sinter in the step (i) has a sintered density of about 75% or more.

18. A method as recited in claim 4, wherein the pressing step (a) comprises intermediate sintering the at least one material to produce an intermediate sinter having a sintered density of about 75% or smaller of the theoretical density wherein in the swaging step (d) the core is swaged to have a green density of about 75 to about 85% of the theoretical density, and wherein in the heating step (e) the core is heated to have a sintered density of about 92% or more of the theoretical density.

19. A method as recited in claim 4, wherein in the pressing step (a), the at least one material to be pressed has a particle size 4 μm or smaller.

20. A method as recited in claim 4, wherein in the pressing step (a), the at least one material to be pressed has a particle size about 2 μm or smaller.

21. A method as recited in claim 20, wherein in the pressing step (a), the at least one material to be pressed has a particle size about 0.7 μm to about 1.5 μm.

22. A method as recited in claim 4, wherein the pressing step (a) comprises calcining the at least one material at about 500° to about 1100° C. for about 1 to about 100 hours in an oxygen atmosphere containing about 90wt.% or more of oxygen for producing a calcined material.

23. A method as recited in claim 22, wherein the pressing step (a) comprises the steps of: pulverizing the calcined material for obtaining a pulverized powder; isostatic pressing the pulverized powder for forming an intermediate compact; and then preliminary sintering the intermediate compact at about 800° to about 950° C. for about 1 to about 50 hours for producing the filling material.

24. A method as recited in claim 23, wherein in the calcining step, the at least one material is calcined at about 950° C. or lower for about 6 to about 50 hours so that the calcined material has an average particle size 10 μm or smaller, and wherein in the preliminary sintering, the intermediate compact is sintered at about 850° to about 950° C. for about 6 to about 50 hours so that the filling material has an average particle size 10 μm or smaller.

25. A method as recited in claim 4, wherein the at least one material of the pressing step (a) comprises the powder of the superconductive oxide,, further comprising the steps of: preparing a molten material containing each element of the superconductive oxide at a ratio to produce the superconductive oxide; and producing a powder from the molten material.

26. A method as recited in claim 25, wherein the powder producing step comprises the steps of: solidifying the molten material for forming a solidified material; and pulverizing the solidified material to form the powder of the superconductive oxide.

27. A method as recited in claim 26, wherein the pulverizing step comprises cutting part of the solidified material, the part being within about 1 mm from a surface of the solidifed material, and wherein the cut part of the solidified material is pulverized to form the powder of the superconductive oxide.

* * * * *